(12) United States Patent
Wada et al.

(10) Patent No.: US 6,407,017 B1
(45) Date of Patent: Jun. 18, 2002

(54) WHOLLY AROMATIC POLYAMIDE FIBER SYNTHETIC PAPER SHEET

(75) Inventors: Masanori Wada; Sadamitsu Murayama; Michikage Matsui, all of Ibaraki (JP)

(73) Assignee: Teijin Limited, Osaka (JP)

( * ) Notice: Subject to any disclaimer, the term of this patent is extended or adjusted under 35 U.S.C. 154(b) by 0 days.

(21) Appl. No.: 09/416,047

(22) Filed: Oct. 12, 1999

(30) Foreign Application Priority Data

Oct. 15, 1998 (JP) .......... 10-293486
Feb. 4, 1999 (JP) .......... 11-027730

(51) Int. Cl.$^7$ .......... D02G 3/00
(52) U.S. Cl. .......... 442/335; 442/336; 442/337; 442/409; 442/415; 428/397; 428/399; 428/400
(58) Field of Search .......... 442/335, 336, 442/337, 409, 415; 428/397, 399, 400

(56) References Cited

U.S. PATENT DOCUMENTS

| | | | |
|---|---|---|---|
| 3,733,964 A | | 5/1973 | Schantz |
| 3,767,756 A | | 10/1973 | Blades et al. |
| 3,869,429 A | | 3/1975 | Blades |
| 4,574,108 A | * | 3/1986 | Fakirov et al. .......... 428/379 |

FOREIGN PATENT DOCUMENTS

| EP | 178 943 | | 4/1986 |
|---|---|---|---|
| EP | 459056 | * | 12/1991 |
| EP | 0 522 441 A2 | | 1/1993 |
| GB | 1 391 501 | | 4/1975 |
| GB | 1 501 948 | | 2/1978 |
| GB | 2 044 668 | | 10/1980 |
| GB | 2 311 304 | | 9/1997 |
| JP | 35-11851 | | 8/1960 |
| JP | 37-5732 | | 6/1962 |
| JP | 47-10863 | | 3/1972 |
| JP | 49-100322 | | 9/1974 |
| JP | 58-144152 | | 8/1983 |
| JP | 1-92233 | | 4/1989 |
| JP | 01-092233 | | 4/1989 |
| JP | 2-47392 | | 2/1990 |
| JP | 2-236907 | | 9/1990 |
| JP | 4-6708 | | 1/1992 |
| JP | 4-65513 | | 3/1992 |
| JP | 04-065513 | | 3/1992 |
| JP | 11-180757 | * | 7/1999 .......... C04B/28/18 |

* cited by examiner

Primary Examiner—Elizabeth M. Cole
(74) Attorney, Agent, or Firm—Sughrue Mion, PLLC (57) ABSTRACT

A wholly aromatic polyamide (aramid) fiber synthetic paper sheet includes 70–96 wt % of an aramid staple fiber component which includes 30 wt % or more of a para-type aramid staple fibers each having two or more annular projections spaced from each other and having an average ratio R/γ of the largest diameter R of the annular projections to the smallest diameter γ of the annular projection-free portions of the staple fiber, of 1.1 or more, and 4–30 wt % of a binder component, namely a resinous binder and/or heat resistant fibrids.

14 Claims, 1 Drawing Sheet

WHOLLY AROMATIC POLYAMIDE FIBER SYNTHETIC PAPER SHEET

BACKGROUND OF THE INVENTION

1. Field of the Invention

The present invention relates to a wholly aromatic polyamide fiber synthetic paper sheet. More particularly, the present invention relates to a wholly aromatic polyamide fiber synthetic paper sheet having excellent heat resistance and electric insulating property at a high humidity and thus being useful for preparing a prepreg and a laminate plate for electric circuit.

2. Description of the Related Art

It is well known that, for substrate materials usable for electric circuit laminate plates, high heat resistance, heat-resistant dimensional stability, humidity resistant-dimensional stability, electric insulating property, resistance to deformation, (for example, distortion, curling and corrugation) and light weight are required. Wholly aromatic polyamide fiber synthetic paper sheets are excellent in heat resistance, electric insulating property, heat resistant dimensional stability and are lightweight in comparison with other synthetic paper sheets, and thus are currently utilized in the field of the substrate materials for electric circuit laminate plates.

For example, (1) Japanese Unexamined Patent Publications No. 2-236,907 and No. 2-106,840 disclose synthetic paper sheets formed from poly-m-phenylene isophthalamide staple fibers (trademark: CORNEX made by TEIJIN LIMITED) and poly-m-phenylene isophthalamide pulp fibers (fibrids); (2) Japanese Unexamined Patent Publication No. 1-92,233 discloses a wholly aromatic polyamide fiber synthetic paper sheet formed from poly-p-phenylene terephthalamide staple fibers (trademark: Kevler, made by DU PONT) or copoly-p-phenylene/3,4'-oxydiphenylene terephthalamide staple fibers (trademark: TECHNOLA, made by TEIJIN LTD.) and an organic resin binder; and (3) Japanese Unexamined Patent Publication No. 2-47,392 discloses a process for producing a wholly aromatic polyamide fiber synthetic paper sheet.

The above-mentioned wholly aromatic polyamide fiber synthetic paper sheet (1) is advantageous in high heat resistance. However, the synthetic paper sheet (1) is disadvantageous in that not only when the sheet (1) is heat treated at a high temperature of 250° C. or more, the sheet (1) shrinks to change the dimensions thereof, but also in that, since the aromatic polyamide fibers have a high equilibrium moisture content (water content) and a high content of impurity ions, when the synthetic paper sheet (1) is held at a high humidity for a long period, the sheet (1) exhibits a poor electric insulating property, and thus cannot be used for the insulating substrate material. Also, the synthetic paper sheet (2) is advantageous in that the equilibrium moisture content and impurity ion content of the sheet (2) are low. However, the synthetic paper sheet (2) is disadvantageous in that, since the sheet (2) contains only the organic resin as a binder component and in the production procedure of the synthetic paper sheet (2), the binder component migrates to the front and back surface sides of the sheet (2) and is locally contained in the sheet (2), the content of the binder component in the middle portion of the sheet (2) becomes small. Thus, the uniformity of the synthetic paper sheet (2) in the direction of thickness thereof is low and the reliability of the sheet (2) is reduced.

As mentioned above, when the synthetic paper sheets (2) are used as a substrate material for producing the electric circuit laminate plate, in the production procedures for the substrate material, particularly prepreg preparation procedures in which the synthetic paper sheets (2) are impregnated with a mixed varnish containing, for example, an epoxy resin, and dried, and a laminate-shaping procedure in which the prepregs are laminated and shaped, the variability of the distribution of the amount of the mixed varnish impregnated in or adhered to the synthetic paper sheets (2) (especially in the direction of the thickness of the sheets 2) is increased; that a portion of the binder resin is melted so as to cause the adhesion between the fibers to decrease and the synthetic paper sheets to be broken; the staple fibers in the synthetic paper sheets are made easily movable in relation to each other, and thus the uniformity in the distribution of the staple fibers in the synthetic paper sheets is decreased; and, particularly, a deformation of the electric circuit laminate plate is created after a solder-reflow procedure is completed. Therefore, the synthetic paper sheets (2) are not preferred for the electric circuit laminate plate.

To solve the above-mentioned problems, Japanese Unexamined Patent Publication No. 61-160,500 discloses a high density para-aramid fiber synthetic paper sheet in which, as a binder component, meta-type wholly aromatic polyamide fibrids are used in place of the organic resin, and a blend of para-type wholly aromatic polyamide staple fibers (for example, KEVLER (trademark) made by DU PONT) with the finely fibrillated para-type wholly aromatic polyamide fibers (for example, KEVLER, made by DU PONT) is used in combination with the binder component fibrids. The synthetic paper sheet exhibits excellent heat resistance, heat resistant dimensional stability, humidity resistant dimensional stability and resistance to deformation, for example, distortion, curling and corrugation. However, the synthetic paper sheet is disadvantageous in that, in the structure of the synthetic paper sheet, the finely fibrillated para-type wholly aromatic polyamide fibers fill the spaces formed between the para-type wholly aromatic polyamide staple fibers and they are bonded to each other with the fibrids, and therefore, when the synthetic paper sheet is used as a substrate material for the electric circuit laminate plate, the synthetic paper sheet exhibits a reduced impregnation property for the mixed varnish containing, for example, an epoxy resin, and thus the synthetic paper sheet is sometimes unevenly and/or insufficiently impregnated with the mixed varnish, and the resultant electric circuit laminate plate often exhibits an insufficient electric insulating property. Therefore, there is a strong demand to solve the above-mentioned problems of the synthetic paper sheet.

SUMMARY OF THE INVENTION

An object of the present invention is to provide a wholly aromatic polyamide fiber synthetic paper sheet having excellent heat resistance and electric insulating properties and useful for a substrate material of an electric circuit laminate plate.

Another object of the present invention is to provide wholly aromatic polyamide fiber synthetic paper sheet which is useful as a substrate material of an electric circuit laminate plate having a high resistance to deformations (for example, distortion, curling and corrugation) during the production thereof, and a high electric insulating property even at a high humidity.

The above-mentioned objects can be attained by the wholly aromatic polyamide fiber synthetic paper sheet of the present invention, which comprises 70 to 96% by weight of a wholly aromatic polyamide staple fiber component and 4 to 30% by weight of a binder component comprising at least one member selected from the group consisting of organic resinous binders and heat-resistant organic polymer fibrids, the wholly aromatic polyamide staple fiber component including 30% by weight or more of para-type wholly aromatic polyamide staple fibers each having at least two annular projections expanding from the peripheral surface of the staple fiber, spaced from each other, and having an average ratio R/γ of the largest diameter R of the annular projections to the smallest diameter γ of the annular projection-free portions of the staple fiber, of 1.1 or more.

Preferably, in the wholly aromatic polyamide fiber synthetic paper sheet of the present invention, the wholly aromatic polyamide staple fibers have a thermal decomposition-starting temperature of 310° C. or more, a tensile strength of 16.67 dtex (15 g/denier) and an ultimate elongation of 8% or less.

In the wholly aromatic polyamide staple fiber synthetic paper sheet of the present invention, the wholly aromatic polyamide for the wholly aromatic polyamide staple fibers preferably contain at least 80 molar % of recurring divalent aromatic amide units of the general formula (I):

—NH—Ar$_1$—NHCO—Ar$_2$—CO—  (I)

wherein Ar$_1$ and Ar$_2$ respectingly and independently from each other represent a divalent aromatic group which may have at least one substituent selected from the group consisting of halogen atoms, lower alkyl groups and a phenyl group.

In the formula (I), the aromatic groups Ar$_1$ and Ar$_2$ respectively and independently from each other represent a member selected from the divalent aromatic groups of the formulae:

which may have at least one substituent selected from the group consisting of halogen atoms, lower alkyl groups and a phenyl group.

Preferably, in the wholly aromatic polyamide staple fiber synthetic paper sheet of the present invention, the wholly aromatic polyamide for the wholly aromatic polyamide staple fibers is a co-polymerization product of an acid component consisting of terephthalic acid with a diamine compound consisting of p-phenylenediamine and 3,4'-oxydiphenylenediamine in a molar ratio of 1:3 to 3:1.

In the wholly aromatic polyamide staple fiber synthetic paper sheet of the present invention, the organic resinous binder preferably comprises at least one thermosetting resist selected from epoxy resins, phenolic compound-formaldehyde resins, polyurethane resins and melamine-formaldehyde resins.

In the wholly aromatic polyamide staple fiber synthetic paper sheet of the present invention, the organic resinous binder preferably comprises a thermosetting organic resin having functional epoxy groups and dispersible in water.

In the wholly aromatic polyamide fiber synthetic paper sheet of the present invention, the wholly aromatic polyamide staple fibers preferably have at least two peaks in a histogram of fiber length frequency distribution thereof.

In the fiber length distribution histogram as mentioned above, the difference in staple fiber length between the fibers distributed in the two or more fiber length frequency distribution columns at peaks is preferably at least 1 mm.

The prepreg of the present invention comprises at least one wholly aromatic polyamide fiber synthetic paper sheet of the present invention and a thermosetting resin with which the wholly aromatic polyamide fiber synthetic paper sheet is impregnated.

The laminate plate of the present invention comprises at least one of the prepregs mentioned above heat-shaped under pressure.

DESCRIPTION OF THE PREFERRED EMBODIMENTS

The inventors of the present invention conducted an extensive study for attaining the objects of the present invention. As a result, the inventors found that the objection of the present invention can be attained by using, in a staple fiber component for forming a wholly aromatic polyamide fiber synthetic paper sheet, para-type wholly aromatic polyamide staple fibers each having at least two annular projections expanding from the peripheral surface of the staple fiber, spaced from each other, and having an average ratio of the largest diameter (R) of the annular projections to the smallest diameter (γ) of the annular projection-free portions of the staple fiber, of 1.1 or more. Based on this finding, the present invention was completed.

The wholly aromatic polyamide fiber synthetic paper sheet of the present invention comprises 70 to 96% by weight, preferably 70–90% by weight, of a wholly aromatic polyamide fiber component and 4 to 30% by weight, preferably 10 to 30% by weight, of a binder component comprising at least one member selected from the group consisting of organic resinous binders and heat-resistance organic polymer fibrids. The wholly aromatic polyamide staple fiber component includes 30% by weight or more, preferably 35% by weight or more, based on the total weight of the staple fiber component, of para-type wholly aromatic polyamide staple fibers each having at least two annular projects expanding from the peripheral surface of the staple fiber, spaced from each other and having an outer size thereof at least 1.1 times, preferably 1.15 to 1.5 times, the average diameter of the annular project-free portions of the staple fibers.

The wholly aromatic polyamide fiber synthetic paper sheet of the present invention may be in the form of a paper sheet, nonwoven fabric or other fiber sheet.

The wholly aromatic polyamide for the wholly aromatic polyamide staple fibers usable for the present invention preferably contains at least 80 molar %, more preferably 90 molar % or more, of recurring divalent aromatic amide units of the general formula (II);

—NH—$Ar_1$—NHCO—$Ar_2$—CO—     (I)

wherein Ar and $Ar_2$ respectively and independently from each other represent a member selected from divalent aromatic groups which may have at least one substituent selected from the group consisting of halogen atoms, lower alkyl groups preferably having 1 to 4 carbon atoms and a phenyl group.

In the general formula (I), the divalent aromatic groups for the $Ar_1$ and $Ar_2$ are preferably selected from the groups of the formulae:

which may have at least one substituent selected from the group consisting of halogen atoms, lower alkyl groups preferably having 1 to 4 carbon atoms and a phenyl group.

The production processes and fiber properties of the above-mentioned wholly aromatic polyamide fibers are disclosed in detail U.K. Patent No. 1,501,948, U.S. Pat. No. 3,733,964, No. 3,767,756 and No. 3,869,425, Japanese Unexamined Patent Publication No. 49-100,322, No. 47-10, 863, No. 58-144,152 and No. 4-65,513.

The wholly aromatic polyamide for the wholly aromatic polyamide staple fibers is preferably selected from para-type wholly aromatic polyamides, for example, poly-para-phenylene terephthalamide and copoly-para-phenylene/3,4'-oxydiphenylene terephthalamide. Generally, meta-type wholly aromatic polyamide fibers exhibit unsatisfactory heat-resistance and are unsuitable for forming the synthetic paper sheets having the above-mentioned desirable properties.

Among the para-type wholly aromatic polyamide fibers, the copoly-para-phenylene/3,4'-oxydipheneylene terephthalamide fibers exhibit excellent heat resistance and other properties, and thus are appropriate for the present invention. The copolyamide is a copolymerization product of an aromatic dicarboxylic acid component consisting of terephthalic acid with an aromatic diamine consisting of p-phenylenediamine and 3,4'-oxydiphenylenediamine. The p-phenylenediamine and the 3,4'-oxydiphenylenediamine are preferably employed in a molar ratice of 1:3 to 3:1, more preferably 1:2 to 2:1, still more preferably 1:1.2 to 1.2:1 and further preferably 1:1.

In the wholly aromatic polyamide staple fibers for the synthetic paper sheet of the present invention, para-type wholly aromatic polyamide staple fibers each having at least two annular projections expanding from the peripheral surface of the staple fiber, spaced from each other and having an average ratio $R/\gamma$ of at least 1.1, preferably 1.15 to 1.5, are included in a content of 30% by weight or more, preferably 35% by weight or more based on the total weight of the wholly aromatic polyamide staple fiber component.

In the wholly aromatic polyamide fiber synthetic paper sheet of the present invention, it is very important that the wholly aromatic polyamide staple fibers are uniformly and firmly bound to each other. To enhance the binding of the staple fibers to each other, the para-type wholly aromatic polyamide (para-aramid) staple fibers having at least two the annular projections per staple fiber expanding from the peripheral surface of the staple fiber, spaced from each other, and having an average ratio $R/\gamma$ of at least 1.1 are contributory.

Namely, the staple fibers having two or more annular projections per staple fiber cause the resultant synthetic fiber sheet the exhibit a significantly enhanced resistance to pulling out the staple fibers from the synthetic paper sheet, and thus the resultant wholly aromatic polyamide fiber synthetic paper sheet exhibits a significantly enhanced reinforcing effect, in comparison with conventional staple fibers free from the annular projects.

Figure 1:
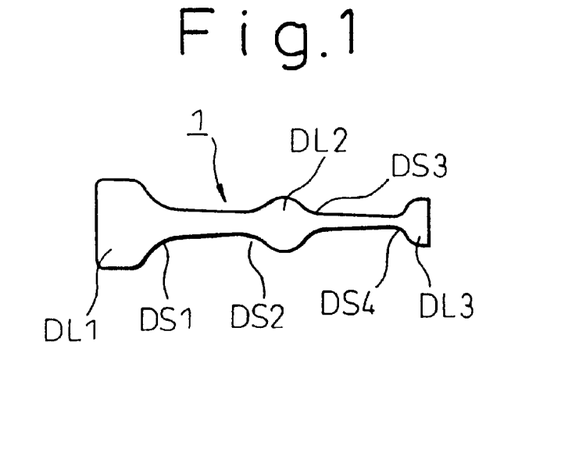
FIG. 1 shows an explanatory side view of a wholly aromatic polyamide staple fiber having annular projections for the wholly aromatic polyamide fiber synthetic paper sheet of the present invention.

Referring to FIG. 1, a para-type wholly aromatic polyamide staple fiber 1 has three annular projections DL1, DL2 and DL3 and annular projection-free portions, for example, DS1, DS2, DS3 and DS4, of the staple fiber 1.

In the staple fiber of FIG. 1, the annular projection DL1 has a largest diameter R and the annular projection-free portion DS4 has a smallest diameter $\gamma$. Thus the ratio $R/\gamma$ of the staple fiber 1 is a ratio of the largest diameter of the annular projection DL1 to the smallest diameter of the annular projection-free portion DS4 of the staple fiber 1.

The largest diameter of the annular projections is measured by using an optical microscope.

Also, the smallest diameter of the annular projection-free portions of the staple fiber is measured by using an optical microscope.

When the staple fiber has one or more small annular projections having an average ratio $R/\gamma$ of less than 1.1, these small annular projections are not counted as annular projections as defined in the present invention.

The para-type wholly aromatic polyamide staple fiber must have two or more annular projections located along the longitudinal axis of each staple fiber and spaced from each other.

Figure 2:
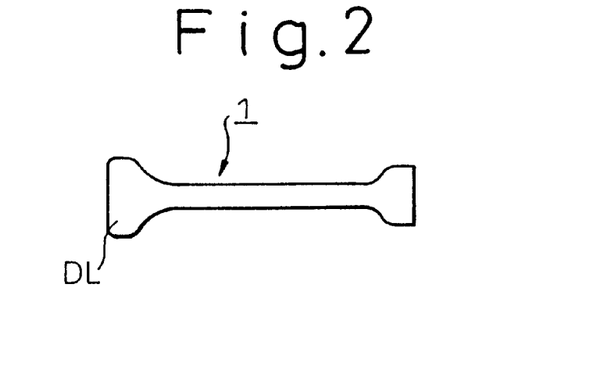
FIG. 2 shows an explanatory side view of another wholly aromatic polyamide staple fiber having annular projections for the wholly aromatic polyamide fiber synthetic paper sheet of the present invention.

There is no specific limitation to the location of the annular projections. When the annular projections are located in the two ends of the staple fiber as shown in FIG. 2 or close to the two ends as shown in FIG. 3, the resultant staple fiber has an excellent resistance to pulling out from the synthetic paper sheet and exhibits an enhanced reinforcing effect.

Figure 3:
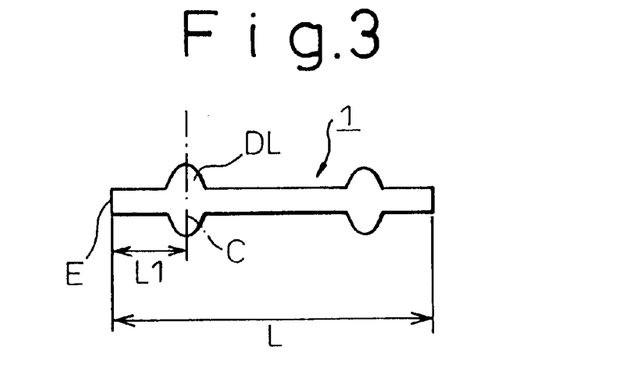
FIG. 3 shows an explanatory side view of another wholly aromatic polyamide staple fiber having annular projections for the wholly aromatic polyamide fiber synthetic paper sheet of the present invention.

As shown in FIG. 3, when the annular projections are located close to but not in the ends of the staple fiber, a distance L1 between an end E of the staple fiber, and the center line C of an annular projections DL is preferably 20% or less of the entire length L of the staple fiber 1.

In the wholly aromatic polyamide staple fiber component for the synthetic paper sheet of the present invention, the content of the para-type wholly aromatic polyamide staple fibers having the annular projections must be 30% by weight or more, preferably 35% by weight or more. If the content of the annular project-having staple fibers is less than 30% by weight, the resultant synthetic paper sheet exhibits an insufficient mechanical strength and an unsatisfactory reinforcing effect for a prepreg or laminate plate.

The staple fibers having the annular projections of the present invention can be produced by intermittently changing the conditions of the melt-spinning and drawing procedures, for example, the extruding rate of the resin melt through a spinneret and the tension of the drafted filaments in the melt-spinning procedure and the draw ratio in the drawing procedure, or by cutting the drawn filaments while applying a tension to the filaments so that the annular projections are formed in the two end portions of the cut fiber due to a snap-back phenomenon of the art fiber.

The wholly aromatic polyamide staple fibers for the staple fiber component preferably have an individual fiber thickness of 0.33 to 5.56 dtex (0.3 to 5.0 denier). When the fiber thickness is less than 0.33 dtex (0.3 denier), the thin wholly aromatic polyamide fibers may be difficult to industrially produce. Namely during the fiber-producing procedures, fiber breakage or fluff formation on the fibers may often occur and thus not only the staple fibers having the good quality may be difficult to stably produce, but also, the production cost of the staple fibers may undesirably increase. Also, when the thickness is more than 5.56 dtex (5.0 denier), the resultant staple fibers may exhibit unsatisfactory mechanical properties, particularly tensile strength, and thus may be unsuitable in practice. The wholly aromatic polyamide staple fibers may be partially and mechanically fibrillated. However, if the content of the fibrillated portions is too high, the resultant synthetic paper sheet may exhibit an unsatisfactory capacity for the impregnation of the mixed varnish therein and thus may be difficult to attain the objects of the present invention. Therefore the degree of fibrillation for the aromatic polyamide staple fibers should be carefully controlled.

The wholly aromatic polyamide staple fibers for the fiber component preferably have a fiber length of 2 to 12 mm, more preferably 3 to 10 mm. When the fiber length is less than 2 mm, the resultant wholly aromatic polyamide fiber synthetic paper sheet (fiber aggregate) may exhibit unsatisfactory mechanical properties. When the fiber length is more than 12 mm, the resultant staple fibers may exhibit a degraded opening property and a reduced dispersibility and thus the resultant synthetic paper sheet (fiber aggregate) may exhibit a degraded uniformity and an insufficient mechanical properties for practice.

In the synthetic paper sheet of the present invention, the wholly aromatic polyamide staple fiber component may include, in addition to the aromatic polyamide staple fibers, other staple fibers, for example, glass staple fibers, polyetherether-ketone staple fibers, polyetherimide staple fibers, polyphenylenesulfide staple fibers and ceramic staple fibers, in a content which does not affect on the desired properties of the target synthetic paper sheet. In this case, the content of the wholly aromatic polyamide staple fibers based on the total weight of the staple fiber component of the synthetic paper sheet of the present invention is preferably 80% by weight or more, more preferably 90% by weight or more.

In the synthetic paper sheet of the present invention, the binder component is in a content of 4 to 30% by weight, preferably 10 to 30% by weight and comprises at least one member selected from the group consisting of organic resinous binders and heat-resistant organic polymer fibrids.

The organic resinous binders usable for the present invention preferably include thermosetting resins, for example, epoxy resins, phenol-formaldehyde polycondensation resins, polyurethane resins and melamine-formaldehyde polycondensation resins. Among the thermosetting resins, the epoxy resins having epoxy groups contained in the molecules thereof and dispersible in water have a high compatibility with the mixed varnish which is impregnated in the synthetic paper sheet in the production of a prepreg, and thus are preferably employed as a binder for the synthetic paper sheet of the present invention.

The organic polymer fibrids usable as a binder for the synthetic paper sheet of the present invention, are preferred to fine and short fibers in an unfixed form of, for example, a thin leaf a flake, a small scale or a randomly fibrillated fine fiber, and include the fibrids produced by mixing an organic polymer solution with a precipitating medium for the polymer solution while agitating the organic polymer solution mixture under shear force in accordance with the method disclosed in Japanese Examined Patent Publication No. 35-11,851 or No. 37-5,732, and the fibrids produced by applying a mechanical shear force, for example, beating force, to a shaped material formed from a polymer solution exhibiting an optical anisotropy and having a molecular orientation, to randomly fibrillate the shaped material. The latter fibrids are preferably employed for the present invention.

The organic polymers for the binder fibrids can be selected from heat-resistant fiber or film-forming polymers having a thermal decomposition-starting temperature of 300° C. or more. For example, the heat resistant fiber or film-forming polymers usable for the binder fibrids can be selected from aromatic copolyamides, melt liquid crystalline wholly aromatic polyesters, heterocyclic structure-containing aromatic polymers. Among the above-mentioned polymers, a copoly-para-phenylene/3,4'-oxyphenylene terephthalamide available under the trademark of TECHNOLA, made by TEIJIN LIMITED and having low content of impurity ions, and a melt liquid crystalline wholly aromatic copolyester produced from an acid component comprising p-hydroxybenzoic acid and 2,6-hydroxynaphthoic acid and a diol component, and available under the trademark of VECTORAN, made by K.K. KURARAY are preferably used. Also, when a high heat resistance is required to the fibrids, a poly-paraphenylene benzoxyzole (trademark; PBO, made by TOYO BOSEKI K.K.) is advantageously employed.

In the wholly aromatic polyamide fiber synthetic paper sheet of the present invention, the content of the binder component comprising at least one member selected from the organic resinous binder and the heat-resistant organic polymer fibrids is in the range of from 4 to 30% by weight, preferably 6 to 15% by weight, based on the synthetic paper sheet. When the content of the binder component is less than 4% by weight, the bonding property and adhesive property of the staple fibers to each other through the binder during the synthetic paper-forming procedure is insufficient, and thus the resultant synthetic paper sheet exhibits an insufficient tensile strength and is easily broken during a calendering procedure and/or the prepreg-producing procedure in which the synthetic paper sheet is impregnated with a mixed varnish. When the binder component content is more than 30% by weight, the resultant synthetic paper sheet exhibits a poor capacity for the impregnation of the mixed varnish therein and thus the mixed varnish is unevenly or insufficiently impregnated in the synthetic paper sheet. Therefore, the impregnated mixed varnish cannot sufficiently exhibit the function thereof, and thus the resultant prepreg is inadequate as a substrate material for the electric circuit laminate plate.

The wholly aromatic polyamide fiber synthetic paper sheet of the present invention may be produced by any conventional synthetic paper-forming methods. For example, wholly aromatic polyamide staple fibers are taken in a desired weight, and uniformly suspended in a consistency of 0.15 to 0.40% by weight in water to form an aqueous fiber slurry; optionally the aqueous fiber slurry is mixed with a dispersing agent and/or a viscosity modifier, the resultant aqueous fiber slurry is subjected to a wet synthetic paper-forming procedure using a paper machine, for example a wire paper machine or a cylinder paper machine; to the resultant wet synthetic paper sheet, a desired solid weight of an organic resinous binder is applied by using a spraying system; the binder applied wet synthetic paper sheet is dried; and the dried synthetic paper sheet is finished by a heat-pressing treatment, to produce a wholly aromatic polyamide fiber synthetic paper sheet.

Alternatively, the wholly aromatic polyamide staple fibers are opened by using a high velocity fluid stream and randomly accumulated on a belt to form a staple fiber web; an organic resinous binder is applied in a desired solid weight to the staple fiber web; the binder-applied staple fiber web is heat-pressed and dried to produce a wholly aromatic polyamide fiber synthetic paper sheet.

Alternatively, a mixture of wholly aromatic polyamide staple fibers with heat-resistant organic polymer fibrids in a desired mixing weight ratio is uniformly suspended, at a consistency of the staple fibers of 0.15 to 0.35% by weight, in water to form an aqueous fiber/fibrid slurry; optionally a dispersing agent and/or a viscosity modifier is added to the slurry; the resultant aqueous fiber/fibrid slurry was subjected to a wet paper-forming procedure using a paper machine such as a wire paper machine or a cylinder paper machine; optionally to the resultant wet synthetic paper sheet, an organic resinous binder is applied by using a spraying system; the wet synthetic paper sheet is dried and heat-pressed to such an extent that the resultant sheet achieves a desired bulk density, the polymer fibrids are partially softened and/or wetted and the staple fibers are partially bonded to each other through the softened and/or melted polymer fibrids. When the above-mentioned heat-pressing procedure is carried out by using a calender machine, preferably the calender machine is provided with a hard surface roll having a diameter of about 15 to 80 cm and a surface-deformable elastic roll having a diameter of about 30 to 100 cm, and the heat pressing is effected between the hard surface roll and the elastic roll. More preferably, the heat-pressing procedure is carried out between a pair of hard surface rolls each having a diameter of about 20 to 80 cm. In the calendering procedure, the organic polymer fibrids in the synthetic paper sheet are softened or partially melted preferably at a temperature of 220 to 400° C., more preferably 250 to 350° C., still more preferably 280° C. to 330° C., to allow the fibrids to serve as a binder for the wholly aromatic polyamide staple fibers, and are pressed preferably under a linear pressure of 150 to 250 kg/cm, more preferably 180 to 250 kg/cm. The calender treatment may be carried out by a single step procedure. To obtain a synthetic paper sheet having a high uniformity in the direction of thickness of the sheet, the calender treatment is preferably carried out in two or more step procedure including a preliminary heat-pressing step.

In the wholly aromatic polyamide fiber synthetic paper sheet of the present invention, the wholly aromatic polyamide staple fibers preferably have at least two peaks in a histogram of fiber length frequency distribution thereof.

Namely, the staple fibers include at least two groups of staple fibers different in fiber length from each other. In other words, the staple fibers consist of a mixture of staple fibers different in fiber length from each other. In this case, the wholly aromatic polyamide staple fibers are more uniformly dispersed in the resultant synthetic paper sheet in comparison with the conventional staple fibers having a uniform fiber length.

Therefore, the resultant wholly aromatic polyamide fiber synthetic paper sheet exhibit a high resistance to deformation, for example, a distortion, curling and corrugation, during the production procedures for an electric circuit laminate plate from the synthetic paper sheet, and a high electric insulating property even at a high humidity, and thus exhibit an enhanced reinforcing effect for the electric circuit laminate plate.

The wholly aromatic polyamide staple fibers preferably have a thermal decomposition-starting temperature of 310° C. or more, a tensile strength of 16.67 g/dtex (15 g/denier) or more and an ultimate elongation of 8% or less. Also, the wholly aromatic polyamide staple fibers preferably have a fiber length distributed in the range of from 1 to 10 mm and the fiber length frequency distribution histogram has at least two peaks. When the staple fibers include a group of staple fibers having a fiber length of less than 1 mm in too high a content, the resultant synthetic paper sheet (fiber aggregate) may have an insufficient mechanical properties. Also, when the content of a group of staple fibers having a fiber length of more than 10 mm is too high, the resultant staple fibers may exhibit an unsatisfactory opening property and dispersing property and thus the resultant synthetic paper sheet (fiber aggregate) may exhibit an unsatisfactory uniformity and insufficient mechanical properties.

In the fiber length frequency distribution histogram of the wholly aromatic polyamide staple fibers, the difference in staple fiber length between two or more fibers distributed in two or more fiber length frequency distribution columns at peaks is preferably at least 1 mm, more preferably 2 to 5 mm. Also, the staple fibers preferably have a fiber thickness of 0.33 to 5.56 dtex (0.3 to 5.0 denier).

The wholly aromatic polyamide staple fibers having two or more peaks in the fiber length frequency distribution histogram can be produced by any conventional staple fiber-producing methods, for example, by intermittently changing the melt drawing conditions, for example, melt-spinning speed, polymer melt-extruding rate and melt spinning tension, and/or the drawing conditions, for example, draw ratio, and/or by cutting the non-cut filaments under tension so that a snap back phenomenon occurs on the cut fibers.

The wholly aromatic polyamide fiber synthetic paper sheet is used as a substrate sheet of a prepreg. The prepreg is produced by impregnating at least one wholly aromatic polyamide fiber synthetic paper sheet with a thermosetting resin.

Also, a laminate plate usable for electric circuit plate can be prepared from at least one prepreg by heat-shaping it under pressure.

EXAMPLES

The present invention will be further illustrated by the following examples.

<I> In each of Examples 1 to 11 and Comparative Examples 1 to 4, wholly aromatic polyamide staple fiber and a synthetic paper sheet, a prepreg and a substrate plate for a printed electric circuit were produced by the following procedures.

(1) Production of Wholly Aromatic Polyamide Staple Fibers

Continuous wholly aromatic polyamide filaments having a desired individual filament thickness of 0.33 dtex to 5.56 dtex (0.3 to 5.0 denier) were arranged in parallel to each other while being wetted with water, and were bundled into a filament tow having a total thickness of 111,111 dtex (100,000 denier). The filament tow was subjected to a cutting procedure using a guillotine cutter to produce staple fibers having a desired fiber length of 2 to 12 mm and provided with annular projections formed in the cut end portions of the staple fibers. The ratio of the outer diameter R of the annular projections to the diameter $\gamma$ of the annular projection-free portions of the staple fiber is 1.1 or more.

Separately, wholly aromatic polyamide filaments having a desired individual filament thickness of 0.33 to 5.56 dtex (0.3 to 5.0 denier) were arranged in parallel to each other while being wetted with water and bundled into a filament tow having a total thickness of 111,111 dtex (100,000 denier). The filament tow was cut with a rotary cutter at a high periphery velocity of 5 m/min, or more, under tension into staple fibers having a desired fiber length of 2 to 12 mm. In the resultant staple fibers, the ratio of the outer diameter of the cut end portion to the middle portion of the staple fibers was less than 1.1.

(2) Production of Synthetic Paper Sheet

The wholly aromatic polyamide staple fibers are suspended together with a binder component in water, and the resultant fiber slurry was subjected to a paper-forming procedure. The resultant wet synthetic paper sheet was dried at a temperature of 110° C., and was subjected to a calender treatment using a pair of metal rolls at a temperature of 200° C. to 350° C., under a linear pressure of 200 kg/m and at a calender speed of 4 m/min to produce a synthetic paper sheet.

(3) Production of a Prepreg (Impregnated) with a Resin-Mixed Varnish)

A mixed varnish was prepared by dissolving an epoxy resin composition comprising 20% by weight of a high purity bromated bisphenol A type epoxy resin, 56% by weight of a brominated diphenylolpropane novolak-type epoxy resin, 24% by weight of a bisphenol A-type novolak resin, and 0.04% by weight of a curing promoter consisting of 2-methyl-4-methyl-imidazole, in a mixed solvent of methylethylketone with methylcellosolve (p-oxyethylmethylether) in a mixing ratio of 35:65. In the varnish, the epoxy resin content was 35% by weight.

A wholly aromatic polyamide fiber synthetic paper sheet was immersed with the mixed varnish, and dried at a temperature of 110 to 120° C. for 5 to 10 minutes. The resultant prepreg was in B stage and had a content of the epoxy resin of 55% by volume.

(4) Production of a Substrate Plate (Laminate) for Printed Electric Circuit Board Three pieces of the varnish-impregnated and dried prepreg were superposed on each other, and the front and back surfaces of the superposed sheet were superposed respectively with a copper foils having a thickness of 35 $\mu$m, and the resultant copper foil-superposed plate was heat-pressed under a pressure of 20 to 50 kg/cm$^2$ at a temperature of 170 to 260° C. for 60 minutes to cure the epoxy resin impregnated in the synthetic paper sheets, and then the plate was further heat-treated in a hot air drier at a temperature of 230° C. for about 20 minutes.

(5) Formation of via in the Substrate Plate for Electric Circuit Laminate Plate The front copper foil layer of the substrate was removed by etching, and then a via having a diameter of 200 $\mu$m was formed in the substrate plate by using a carbon dioxide laser beam.

<II> The substrate plate for the printed electric circuit was subjected to the tests of bulk density tensile strength, interlaminar peeling strength, and thermal dimensional change of the synthetic paper sheet, and warping (curling) degree of the substrate plate for printed electric circuit, and others, by the following methods.

(1) Determination of the Ratio R/$\gamma$=X of Wholly Aromatic Polyamide Staple Fibers One hundred wholly aromatic polyamide staple fibers were observed by an optical microscope, and the largest diameters Rn (n=1 to 100) of the annular projections of the staple fibers and the smallest diameter $\gamma$n (n=1 to 100) of the annular projection-free portions of the staple fibers were measured, and the ratio Xn=Rn/$\gamma$n (n=1 to 100) was calculated. An average of Xn was calculated in accordance with the following equation.

$$X \text{ (average)} = (X_1 + X_2 + \ldots X_{100})/100$$

(2) Bulk Density of Synthetic Paper Sheet

The bulk density of synthetic paper sheet was determined in accordance with Japanese Industrial Standard (JIS) C 2111, Section 6.1.

(3) Tensile Strength of Synthetic Paper Sheet

The tensile strength of synthetic paper sheet was measured by using a constant stretching rate type tensile tester in accordance with JIS C 2111, Section 7.

(4) Interlaminar Peeling Strength of Synthetic Paper Sheet

A specimen of a synthetic paper sheet having a length of 200 mm and a width of 15 mm was cut along a center line of an edge side surface of the longitudinal end of the specimen in parallel to the front and back surfaces of the specimen, from the edge side surface into the inside at a deepness of 15 mm. The cut upper and lower portions of the specimen were gripped and peeled off from each other at a peeling angle of 180 degree by using a constant stretching rate tensile tester, to measure of the interlaminar peeling strength of the specimen.

(5) Thermal Dimensional Change of Synthetic Paper Sheet

A specimen of synthetic paper sheet having a length of 250 mm and a width of 50 mm was heated at a temperature of 280° C. for 5 minutes, and the lengths of the specimen was measured before and after the heating. The thermal dimensional change (TDC) of the synthetic paper sheet was calculated in accordance with the following equation.

$$TDC = \frac{(L_1 - L_0)}{L_0} \times 100$$

wherein $L_1$ represents the length of the specimen after heating and $L_0$ represents the length of the specimen before heating.

(6) Warping (Curling) Test for Substrate Plate for Printed Electric Circuit

The substrate sheet for the printed electric circuit board as mentioned in <I>-(4) was cut into dimensions of 150 mm×150 mm. The cut laminate plate specimen was subjected to an etching procedure in which on each surface of the laminate plate, the copper foil was partially removed in such a manner that a square inner portion of the copper foil in the dimensions of 110 mm×110 mm was removed to leave an edge portion of the copper foil in a square frame form having a width of 20 mm, to prepare a specimen for deformation (warping) test.

The specimen was heat-treated at a temperature of 260° C. for 10 minutes, and the heat-treated specimen was placed on a horizontal plate surface so that a center point of the specimen came into contact with the horizontal surface. When the specimen placed on the horizontal surface was in a deformed (warped (curled), corrugated or distorted) form, a largest height of four corners of the specimen from the horizontal surface was measured. The degree of warping of the substrate plate for electric circuit board was represented by the largest height.

(7) Length of Staple Fiber

From an aqueous staple fiber slurry for forming a synthetic paper sheet, 200 staple fibers were taken, the thickness of the staple fibers were measured and a fiber length frequency distribution histogram was prepared in every column width of 0.5 mm.

(8) Precision of via of Electric Circuit Laminate Plate

An electric circuit laminate plate having a via was cut perpendicularly to the front and back surfaces of the plate through the via. The crosssectional diameter of the via was measured at every 5 μm along the longitudinal direction of the via, and the precision in the diameter of the via was calculated in accordance with the following equation via precision in $\% = \{(V_{max} - V_{min})/(V_{ave})\} \times 100$ wherein $V_{max}$ represent a largest diameter of the via, $V_{min}$ represents a smallest diameter of the via and $V_{ave}$ represent an average of the measured diameters of the via.

The via precision was evaluated in three classed as below.

Excellent: via precision<0.5%

Good: 5%≦via precision<10%

Bad: 10%≧via precision

Example 1

A wholly aromatic polyamide fiber synthetic paper sheet comprising 92% by weight of a wholly aromatic polyamide staple fiber component and 8% by weight of an epoxy resin binder component was produced by subjecting an aqueous fiber slurry containing a fiber mixture of 77% by weight (83.7% by weight based on the total weight of the staple fiber component) of copoly-para-phenylene/3,4'-oxydiphenylene terephthalamide staple fibers having an individual fiber thickness of 1.66 dtex (1.5 denier) and a fiber length of 3 mm, and available under the trademark of TECHNOLA from TEIJIN LTD. and 15% by weight (16.3% by weight based on the total weight of the staple fiber component) of poly-meta-phenylene isophthalamide staple fibers having an individual fiber thickness of 3.33 dtex (3.0 denier) and a fiber length of 6 mm, to a paper-forming procedure; by spraying a water-diluted liquid of a bisphenol A epichlorohydrin type water-dispensible epoxy resin 1 (trademark: DICKFINE EN-0270, made by DAINIPPON INK KAGAKUKOGYO K.K.) to the resultant wet synthetic paper sheet and by drying the epoxy resin sprayed synthetic paper sheet in a hot air drier at a temperature of 160° C. for about 20 minutes.

In the production of the copoly-para-phenylene/3,4'-oxydiphenylene terephthalamide staple fibers (trademark: TECHNOLA, made by TEIJIN LTD.), the cutting procedure was carried out by using a guillotine cutter and the resultant staple fibers each had two annular projections formed at the two ends thereof and had a ratio R/γ of 1.15. Also, in the production of the poly-meta-phenylene isophthalamide staple fibers, the cutting procedure was carried out by using a rotary cutter at a velocity of 8 m/min. The resultant staple fibers had a ratio R/γ of 1.02.

The composition of the resultant synthetic paper sheet is shown in Table 1. Also the test results of the synthetic paper sheet is shown in Table 2.

Example 2

A wholly aromatic polyamide fiber synthetic paper sheet was produced by the same procedures as in Example 1, except that the copoly-para-phenylene/3,4'-oxydiphenylene tereththalamide staple fibers were used in an amount of 55% by weight and the poly-meta-phenylene isophthalamide staple fibers were used in an amount of 37% by weight based on the total weight of the synthetic paper sheet.

The composition and the test results of the resultant synthetic paper sheet are shown in Table 1 and Table 2, respectively.

Example 3

A wholly aromatic polyamide fiber synthetic paper sheet was produced by the same procedures as in Example 1, except that the 77% by weight of copoly-para-phenylene-3,4'-oxydiphenylene terephthalamide staple fibers were replaced by 77% by weight of poly-para-phenylene terephthalamide staple fibers having an individual fiber thickness of 1.66 dtex (1.5 denier) and a fiber length of 3 mm and available under the trademark of KEVLER 49 from DU PONT.

The composition and the test results of the resultant synthetic paper sheet are shown in Table 1 and Table 2, respectively.

Example 4

A wholly aromatic polyamide fiber synthetic paper sheet was produced by the same procedures as in Example 1, except that the 77% by weight of copoly-para-phenylene-3,4'-oxydiphenylene terephthalamide staple fibers were replaced by 77% by weight of poly-paraphenylene terephthalamide staple fibers having an individual fiber thickness of 1.58 dtex (1.42 denier) and a fiber length of 3 mm and available under the trademark of KEVLER 49 from DU PONT.

The composition and the test results of the resultant synthetic paper sheet are shown in Table 1 and Table 2, respectively.

Example 5

A wholly aromatic polyamide fiber synthetic paper sheet was produced by the same procedures as in Example 1, except that the copoly-para-phenylene/3,4'-oxydiphenylene tereththalamide staple fibers were used in an amount of 80% by weight, the poly-meta-phenylene isophthalamide staple fibers were used in an amount of 15% by weight and the epoxy resin binder was used in an amount of 5% by weight.

The composition and the test results of the resultant synthetic paper sheet are shown in Table 1 and Table 2, respectively.

Example 6

A wholly aromatic polyamide fiber synthetic paper sheet was produced by the same procedures as in Example 1, except that the copoly-para-phenylene/3,4'-oxydiphenylene terephthalamide staple fibers were used in an amount of 72% by weight, the poly-meta-phenylene isophthalamide staple fibers were used in an amount of 13% by weight and the epoxy resin binder was used in an amount of 15% by weight.

The composition and the test results of the resultant synthetic paper sheet are shown in Table 1 and Table 2, respectively.

Example 7

A wholly aromatic polyamide fiber synthetic paper sheet was produced by the same procedures as in Example 1, except that the copoly-para-phenylene/3,4'-oxydiphenylene terephthalamide staple fibers were used in an amount of 64% by weight, the poly-meta-phenylene isophthalamide staple fibers were used in an amount of 11% by weight and the epoxy resin binder was used in an amount of 25% by weight.

The composition and the test results of the resultant synthetic paper sheet are shown in Table 1 and Table 2, respectively.

Example 8

A wholly aromatic polyamide fiber synthetic paper sheet was produced by the same procedures as in Example 1, except that the fiber length of the copoly-para-phenylene/3,4'-oxydiphenylene terephthalamide staple fibers was thanged to 5 mm, and the fiber length of the poly-meta-phenylene isophthalamide staple fibers was changed to 10 mm.

The composition and the test results of the resultant synthetic paper sheet are shown in Table 1 and Table 2, respectively.

Example 9

A wholly aromatic polyamide fiber synthetic paper sheet was produced by the same procedures as in Example 1, except that after the cutting procedure using the guillotine cutter, the resultant copoly-para-phenylene/3,4'-oxydiphenylene terephthalamide staple fibers had a ratio $R/\gamma$ of 1.25.

The composition and the test results of the resultant synthetic paper sheet are shown in Table 1 and Table 2, respectively.

Example 10

A wholly aromatic polyamide fiber synthetic paper sheet was produced by the same procedures as in Example 1, except that the copoly-para-phenylene/3,4'-oxydiphenylene terephthalamide staple fibers cut by the guillotine cutter had an individual fiber thickness of 0.83 dtex (0.75 denier) and a ratio $R/\gamma$ of 1.12.

The composition and the test results of the resultant synthetic paper sheet are shown in Table 1 and Table 2, respectively.

Example 11

A wholly aromatic polyamide fiber synthetic paper sheet was produced by the same procedures as in Example 1, except that the epoxy resin binder was replaced by 8.0% by weight of fibrids of a copoly-para-phenylene/3,5'-oxydiphenylene terephthalamide made by TEIJIN LIMITED and having an equilibrium water content of 4.1%. The staple fiber component and the fibrid binder components were uniformly suspended in water with the aid of a dispensing agent (trademark: YM-80, made by MATSUMOTO YUSHI K.K.) in an amount of 0.02% by weight, to prepare an aqueous fiber/fibrid slurry having a total fiber/fibrid content of 0.15% by weight.

The fiber/fibrid slurry was subjected to a paper-forming procedures using to a TAPPI type band square paper-forming machine; and the resultant wet synthetic paper sheet was lightly dewatured under pressure, and dried in a hot air dryer at a temperature of 150° C. for 15 minutes. The resultant wholly aromatic polyamide fiber synthetic paper sheet was heat-pressed by using a high temperature high pressure calender machine having a pair of surface-hardened metal rollers with a diameter of about 400 mm, at a temperature of 320° C. under a linear ressure of 200 kg/cm, to partially melt or softened the copoly-para-phenylene/3,4'-oxidiphenylene terephthalamide fibrids and to firmly bond the staple fibers through the partially melted and/or softened fibrids.

The composition and the test results of the resultant synthetic paper sheet are shown in Table 1 and Table 2, respectively.

TABLE 1

| Example No. | Aromatic polyamide staple fibers with annular projections | | | | | Annular projection-free aromatic polyamide staple fibers | | | | | Binder | |
|---|---|---|---|---|---|---|---|---|---|---|---|---|
| | Trademark | Fiber thickness (dtex) | Fiber length (mm) | $R/\gamma$ | Content (wt %) | Trademark | Fiber thickness (dtex) | Fiber length (mm) | $R/\gamma$ | Content (wt %) | Type | Content (wt %) |
| 1 | TECH- | 1.67 | 3 | 1.15 | 77 | CORNEX | 3.33 | 6 | 1.02 | 15 | Resin | 8 |
| 2 | NOLA | 1.67 | 3 | 1.15 | 55 | | 3.33 | 6 | 1.02 | 37 | Resin | 8 |
| 3 | KEVLER | 1.67 | 3 | 1.15 | 77 | | 3.33 | 6 | 1.02 | 15 | Resin | 8 |
| 4 | 49 | 1.58 | 3 | 1.13 | 77 | | 3.33 | 6 | 1.02 | 15 | Resin | 8 |
| 5 | TECH | 1.67 | 3 | 1.15 | 80 | | 3.33 | 6 | 1.02 | 15 | Resin | 5 |
| 6 | NOLA | 1.67 | 3 | 1.15 | 72 | | 3.33 | 6 | 1.02 | 13 | Resin | 15 |
| 7 | | 1.67 | 3 | 1.15 | 64 | | 3.33 | 6 | 1.02 | 11 | Resin | 25 |
| 8 | | 1.67 | 5 | 1.15 | 77 | | 3.33 | 10 | 1.02 | 15 | Resin | 8 |

TABLE 1-continued

| | Aromatic polyamide staple fibers with annular projections | | | | Annular projection-free aromatic polyamide staple fibers | | | | | Binder | |
|---|---|---|---|---|---|---|---|---|---|---|---|
| Example No. | Trademark | Fiber thickness (dtex) | Fiber length (mm) | R/γ | Content (wt %) | Trademark | Fiber thickness (dtex) | Fiber length (mm) | R/γ | Content (wt %) | Type | Content (wt %) |
| 9 | | 0.83 | 3 | 1.25 | 77 | | 3.33 | 6 | 1.02 | 15 | Resin | 8 |
| 10 | | 1.67 | 3 | 1.12 | 77 | | 3.33 | 6 | 1.02 | 15 | Resin | 8 |
| 11 | | 1.67 | 3 | 1.15 | 77 | | 3.33 | 6 | 1.021 | 15 | Fibrids | 8 |

TABLE 2

| Example No. | Bulk density (g/cm³) | Tensile strength (Kg/cm) | Interlaminar peeling strength (g/15 mm) | Thermal dimensional change (%) | Warping height (mm) |
|---|---|---|---|---|---|
| 1 | 0.57 | 4.7 | 32.5 | 0.14 | 2.3 |
| 2 | 0.71 | 6.2 | 48.6 | 0.23 | 2.8 |
| 3 | 0.54 | 4.9 | 31.9 | 0.10 | 2.1 |
| 4 | 0.53 | 5.2 | 30.2 | 0.09 | 1.8 |
| 5 | 0.56 | 4.3 | 28.9 | 0.16 | 2.9 |
| 6 | 0.62 | 5.9 | 36.2 | 0.12 | 3.1 |
| 7 | 0.63 | 6.1 | 34.7 | 0.19 | 3.3 |
| 8 | 0.59 | 6.9 | 42.7 | 0.16 | 3.0 |
| 9 | 0.54 | 6.0 | 43.1 | 0.12 | 2.0 |
| 10 | 0.56 | 4.8 | 28.9 | 0.19 | 2.6 |
| 11 | 0.67 | 4.5 | 31.7 | 0.12 | 1.7 |

Comparative Example 1

A wholly aromatic polyamide fiber synthetic paper sheet was produced by the same procedures as in Example 1, except that the staple fiber component was used in an amount of 97% by weight and the resinous binder component was used in an amount of 3% by weight. In the staple fiber component, the copoly-para-phenylene/3,4'-oxydiphenylene terephthalate staple fibers were employed in an amount of 77% by weight (79.4% by weight based on the total weight of the staple fiber component, and the poly-meta-phenylene isophthalate staple fibers were employed in an amount of 20% by weight (20.6% by weight based on the total weight of the staple fiber component).

The composition and the test results of the resultant synthetic paper sheet are shown in Table 3 and Table 4, respectively.

Comparative Example 2

A wholly aromatic polyamide fiber synthetic paper sheet was produced by the same procedures as in Example 1, except that the staple fiber component was used in an amount of 65% by weight and the resinous binder component was used in an amount of 35% by weight. In the staple fiber component, the copoly-para-phenylene/3,4'-oxydiphenylene terephthalate staple fibers were employed in an amount of 55% by weight (84.6% by weight based on the total weight of the staple fiber component, and the poly-meta-phenylene isophthalate staple fibers were employed in an amount of 10% by weight (15.4% by weight based on the total weight of the staple fiber component).

The composition and the test results of the resultant synthetic paper sheet are shown in Table 3 and Table 4, respectively.

Comparative Example 3

A wholly aromatic polyamide fiber synthetic paper sheet was produced by the same procedures as in Example 1, except that the staple fiber component in an amount of 92% by weight comprised the copoly-para-phenylene/3,4'-oxydiphenylene terephthalamide staple fiber in an amount of 25% by weight (27.2% by weight based on the total weight of the staple fiber component) and the poly-meta-phenylene isophthalamide staple fibers in an amount of 67% by weight (72.8% by weight based on the total weight of the staple fiber component).

The composition and the test results of the resultant synthetic paper sheet are shown in Table 3 and Table 4, respectively.

Comparative Example 4

A wholly aromatic polyamide fiber synthetic paper sheet was produced by the same procedures as in Example 1, except that the cutting procedure for the copoly-para-phenylene/3,4-oxydiphenylene terephthalamide staple fibers was carried out by using a rotary cutter at a velocity of 8 m/min, and the resultant staple fibers had a ratio R/γ of 1.03.

The composition and the test results of the resultant synthetic paper sheet are shown in Table 3 and Table 4, respectively.

TABLE 3

| | Aromatic polyamide staple fibers with annular projections | | | | | Annular projection-free aromatic polyamide staple fibers | | | | | Binder | |
|---|---|---|---|---|---|---|---|---|---|---|---|---|
| Comparative Example No. | Trademark | Fiber thickness (dtex) | Fiber length (mm) | R/γ | Content (wt %) | Trademark | Fiber thickness (dtex) | Fiber length (mm) | R/γ | Content (wt %) | Type | Content (wt %) |
| 1 | TECH-NOLA | 1.5 | 3 | 1.15 | 77 | CORNEX | 3.0 | 6 | 1.02 | 20 | Resin | 3 |
| 2 | NOLA | 1.5 | 3 | 1.15 | 55 | | 3.0 | 6 | 1.02 | 10 | Resin | 35 |

TABLE 3-continued

| Comparative Example No. | Aromatic polyamide staple fibers with annular projections | | | | | Annular projection-free aromatic polyamide staple fibers | | | | | Binder | |
|---|---|---|---|---|---|---|---|---|---|---|---|---|
| | Trademark | Fiber thickness (dtex) | Fiber length (mm) | R/γ | Content (wt %) | Trademark | Fiber thickness (dtex) | Fiber length (mm) | R/γ | Content (wt %) | Type | Content (wt %) |
| 3 | | 1.5 | 3 | 1.15 | 25 | | 3.0 | 6 | 1.02 | 67 | Resin | 8 |
| 4 | | 1.5 | 3 | 1.02 | 77 | | 3.0 | 6 | 1.02 | 15 | Resin | 8 |

TABLE 4

| Comparative Example No. | Bulk density (g/cm$^3$) | Tensile strength (Kg/cm) | Interlaminar peeling strength (g/15 mm) | Thermal dimensional change (%) | Warping height (mm) |
|---|---|---|---|---|---|
| 1 | 0.53 | 2.4 | 19.2 | 0.30 | 5.1 |
| 2 | 0.65 | 5.9 | 28.1 | 0.35 | 5.3 |
| 3 | 0.64 | 2.5 | 26.4 | 0.36 | 5.4 |
| 4 | 0.58 | 2.8 | 28.4 | 0.33 | 4.8 |

Examples 12 to 16

In each of Examples 12 to 16, copoly-para-phenylene/3,4'-oxydiphenylene terephthalamide filaments trademark: TECHNOLA, made by TEIJIN LTD.) having an individual fiber thickness of 1.67 dtex (1.5 denier) were bundled into a filament tow having a total thickness of 111,111 dtex (100,000 denier), and the filament tow was cut into staple fiber having a fiber length of 1 to 10 mm by using a guillotine cutter. The staple fibers had a ratio R/γ of 1.18.

Separately, poly-meta-phenylene isophthalate filaments (trademark: CORNEX, made by TEIJIN LTD.) having an individual fiber thickness of 3.33 dtex (3.0 denier) were bundled into a filament tow having a total thickness of 111,111 dtex (100,000 denier). The filament tow was cut into staple fibers having a fiber length of 1 to 10 mm by using a rotary cutter. The staple fibers had a ratio R/γ of 1.03.

The copoly-para-phenylene/3,4'-oxydiphenylene terephthalamide staple fibers and the poly-meta-phenylene isophthalamide staple fibers are blended in the amounts shown in Table 5 with each other, and the staple fiber blend was opened and suspended in water by using a pulper, and a dispersing agent (trademark: YM-80, made by Matsumoto YUSHI K.K.) was added in a content of 0.02% by weight to the aqueous fiber slurry. The slurry had a total fiber content at 0.15% by weight.

The aqueous fiber slurry was subjected to a paper-forming procedure using a TAPPI square type hand paper-forming machine, the resultant wet synthetic paper sheet was dewatered under pressure. Then, a binder liquid containing a water-dispersible epoxy resin binder (trademark: DICKFINE EM-0270, made by DAINIPPON INK KAGAKUKOGYO K.K.) in a solid content of 10% by weight was sprayed onto the wet synthetic paper sheet to impart the epoxy resin binder in a solid amount of 5% by weight based on the dry solid weight of the synthetic paper sheet, and was dried in a hot air dryer at a temperature of 160° C. for about 20 minutes. A synthetic paper sheet having a basis weight of 60 g/m$^2$ was obtained.

The synthetic paper sheet had a fiber length frequency distribution shown in Table 6.

The test results of the synthetic paper sheet is shown in Table 7.

Example 17

A wholly aromatic polyamide fiber synthetic paper sheet was produced by the same procedures as in Example 14, except that the copoly-para-phenylene/3,4'-oxydiphenylene terephthalate staple fibers were replaced by poly-para-phenylene terephthalamide staple fibers (trademark: KEVLER 29, made by DU PONT) having an individual fiber thickness of 1.67 dtex (1.5 denier), fiber lengths of 2 and 4 mm and a ratio R/γ of 1.22.

The composition and the test results of the resultant synthetic paper sheet are shown in Table 5 and Tables 6 and 7, respectively.

Example 18

A wholly aromatic polyamide fiber synthetic paper sheet was produced by the same procedures as in Example 14, except that the copoly-para-phenylene/3,4'-oxydiphenylene terephthalate staple fibers were replaced by poly-para-phenylene terephthalamide staple fibers (trademark: KEVLER 49, made by DU PONT) having an individual fiber thickness of 1.56 dtex (1.4 denier), fiber lengths of 2 and 4 mm and a ratio R/γ of 1.21.

The composition and the test results of the resultant synthetic paper sheet are shown in Table 5 and Tables 6 and 7, respectively.

Example 19

A wholly aromatic polyamide fiber synthetic paper sheet was produced by the same procedures as in Example 12, except that the copoly-para-phenylene/3,4'-oxydiphenylene terephthalamide staple fibers were replaced by poly-para-phenylene benzbisoxazole staple fibers (trademark: ZAILON, made by TOYO BOSEKI K.K.) having an individual fiber thickness of 1.67 dtex (1.5 denier), a fiber length 3 mm and a ratio R/γ of 1.21.

The composition and the test results of the resultant synthetic paper sheet are shown in Table 5 and Tables 6 and 7, respectively.

Comparative Example 5

A wholly aromatic polyamide fiber synthetic paper sheet was produced by the same procedures as in Example 12, except that the fiber lengths of the copoly-para-phenylene/3,5'-oxydiphenyl terephthalamide staple fibers and the poly-meta-phenylene isophthalamide staple fibers were respectively changed to as shown in Table 5.

The composition and the test results of the resultant synthetic paper sheet are shown in Table 5 and Tables 6 and 7, respectively.

Comparative Example 6

A wholly aromatic polyamide fiber synthetic paper sheet was produced by the same procedures as in Example 12, except that the fiber lengths of the copoly-para-phenylene/3,5-oxydiphenylene terephthalamide staple fibers and the poly-meta-phenylene isophthalamide staple fibers and the epoxy resin binder were respectively changed to as shown in Table 5.

The composition and the test results of the resultant synthetic paper sheet are shown in Table 5 and Tables 6 and 7, respectively.

TABLE 5

| | Staple fiber component | | | | | | Binder component | |
|---|---|---|---|---|---|---|---|---|
| | Aromatic polyamide staple fibers with annular projections | | | Annular projection-free aromatic polyamide staple fibers | | | | |
| Item | Type | Fiber | | Type | Fiber | | | |
| Example No. | (trademark) | length (mm) | Content (wt %) | (trademark) | length (mm) | Content (wt %) | Type | Content (wt %) |
| Example | | | | | | | | |
| 12 | TECHNOLA | 3 | 77 | CORNEX | 6 | 15 | Epoxy resin | 8 |
| 13 | | 3 | 80 | | 6 | 16 | | 4 |
| 14 | | 2 | 30 | | 6 | 15 | | 8 |
| | | 4 | 47 | | | | | |
| 15 | | 4 | 58 | | 5 | 34 | | 8 |
| 16 | | 1.5 | 15 | | 5 | 15 | | 8 |
| | | 3 | 62 | | | | | |
| 17 | KEVLER 29 | 2 | 30 | | 6 | 15 | | 8 |
| | | 4 | 47 | | | | | |
| 18 | KEVLER 49 | 2 | 30 | | 6 | 15 | | 8 |
| | | 4 | 47 | | | | | |
| 19 | ZAILON | 3 | 77 | | 6 | 15 | | 8 |
| Comparative Example | | | | | | | | |
| 5 | TECHNOLA | 3 | 77 | | 3 | 15 | | 8 |
| 6 | | 3 | 55 | | 6 | 10 | | 35 |

TABLE 6

| Item Example | Fiber length frequency distribution Fiber length (mm) | | | | | | | | | | |
|---|---|---|---|---|---|---|---|---|---|---|---|
| No. | 1.0- | 1.5- | 2.0- | 2.5- | 3.0- | 3.5- | 4.0- | 4.5- | 5.0- | 5.5- | 6.0- | 6.5- |
| Example | | | | | | | | | | | |
| 12 | | | | 31 | 98 | 39 | | | | 3 | 25 | 4 |
| 13 | | | | 18 | 110 | 62 | | | | | 10 | |
| 14 | | 8 | 71 | 25 | | 9 | 53 | 22 | | | 10 | 2 |
| 15 | | | | | | 8 | 144 | 10 | 31 | 7 | | |
| 16 | 8 | 53 | 17 | 14 | 71 | 23 | | | 11 | 3 | | |
| 17 | | 4 | 79 | 21 | | 6 | 57 | 21 | | 1 | 9 | 2 |
| 18 | | 8 | 76 | 22 | | 2 | 61 | 23 | | 1 | 7 | |
| 19 | | | | 13 | 104 | 27 | | | | 4 | 40 | 12 |
| Comparative Example | | | | | | | | | | | |
| 5 | | | | 9 | 170 | 21 | | | | | | |
| 6 | | | 1 | | 173 | 12 | | | | | 12 | 2 |

TABLE 7

| | Synthetic paper sheet | | | Laminate plate | |
|---|---|---|---|---|---|
| Example No. | Tensile strength (kgf/cm²) | Interlaminar peeling strength (kgf/cm) | Thermal dimensional change (%) | Warping height (mm) | Via precision |
| Example | | | | | |
| 12 | 4.7 | 32.5 | 0.14 | 0.81 | Excellent |
| 13 | 4.1 | 28.8 | 0.25 | 1.01 | Excellent |
| 14 | 5.6 | 49.2 | 0.16 | 0.9 | Excellent |
| 15 | 5.2 | 38.7 | 0.12 | 0.88 | Excellent |
| 16 | 4.4 | 28.8 | 0.11 | 1.1 | Excellent |
| 17 | 4.1 | 29.6 | 0.1 | 0.87 | Excellent |
| 18 | 4.3 | 31.8 | 0.09 | 0.83 | Excellent |
| 19 | 4.8 | 34.6 | 0.08 | 0.81 | Excellent |
| Comparative Example | | | | | |
| 5 | 1.8 | 19.8 | 1.87 | 1.91 | Good |
| 6 | 2.9 | 24.8 | 2.71 | 2.55 | Bad |

The wholly aromatic polyamide fiber synthetic paper sheet of the present invention exhibits excellent heat resistance, thermal dimensional stability, electric insulting property and resistance to deformation, for example, distortion, warping (curling) and corrugation, and thus is useful for prepregs and substrate plates or sheets for electric circuit laminate plates.

What is claimed is:

1. A wholly aromatic polyamide fiber synthetic paper sheet comprising 70 to 96% by weight of a wholly aromatic polyamide staple fiber component and 4 to 30% by weight of a binder component comprising at least one member selected from the group consisting of organic resinous binders and heat-resistant organic polymer fibrids, the wholly aromatic polyamide staple fiber component including 30% by weight or more of para wholly aromatic polyamide staple fibers each having at least two annular projections expanding from the peripheral surface of the staple fiber, spaced from each other, and having an average ratio R/γ of the largest diameter R of the annular projections to the smallest diameter γ of the annular projection-free portions of the staple fibers, of 1.1 or more.

2. The wholly aromatic polyamide fiber synthetic paper sheet as claimed in claim 1, wherein the wholly aromatic polyamide staple fibers have a thermal decomposition-starting temperature of 310° C. or more, a tensile strength of 16.67 g/dtex (15 g/denier) or more and an ultimate elongation of 8% or less.

3. The wholly aromatic polyamide fiber synthetic paper sheet as claimed in claim 1, wherein the wholly aromatic polyamide staple fibers have a fiber length of 2 to 12 mm.

4. The wholly aromatic polyamide fiber synthetic paper sheet as claimed in claim 1, wherein the wholly aromatic polyamide staple fibers have an average individual fiber thickness of 0.33 to 5.56 dtex (0.3–5.0 denier).

5. The wholly aromatic polyamide fiber synthetic paper sheet as claimed in claim 1, wherein the wholly aromatic polyamide for the wholly aromatic polyamide staple fibers contains at least 80 molar % of recurring divalent aromatic amide units of the general formula (I):

—NH—Ar$_1$—NHCO—Ar$_2$—CO— wherein Ar$_1$ and Ar$_2$ respectively and independently from each other represent a divalent aromatic group which may have at least one substituent selected from the group consisting of halogen atoms, lower alkyl groups and a phenyl group.

6. The wholly aromatic polyamide fiber synthetic paper sheet as claimed in claim 5, wherein the Ar$_1$ and Ar$_2$ in the formula (1) respectively and independently from each other represent a member selected from the divalent aromatic groups of the formulae:

which optionally have at least one substituent selected from the group consisting of halogen atoms, lower alkyl group and a phenyl group.

7. The wholly aromatic polyamide fiber synthetic paper sheet as claimed in claim 1, wherein the wholly aromatic polyamide for the wholly aromatic polyamide staple fibers is selected from poly-para-phenylene terephthalamide and copoly-para-phenylene/3,4'-oxydiphenylene-terephthalamide.

8. The wholly aromatic polyamide fiber synthetic paper sheet as claimed in claim 1, wherein the wholly aromatic polyamide for the wholly aromatic polyamide staple fibers is co-polymerization product of an acid component consisting of terephthalic acid with a diamine compound consisting of p-phenylenediamine and 3,4'-oxydiphenylenediamine in a molar ratio of 1:3to3:1.

9. The wholly aromatic polyamide fiber synthetic paper sheet as claimed in claim 1, wherein the organic resinous binder comprises at least one thermosetting resin selected from epoxy resins, phenolic compound-formaldehyde resins, polyurethane resins and melamine-formaldehyde resins.

10. The wholly aromatic polyamide fiber synthetic paper sheet as claimed in claim 1, wherein the organic resinous binder comprises a thermosetting organic resin having functional epoxy groups and dispersible in water.

11. The wholly aromatic polyamide fiber synthetic paper sheet as claimed in claim 1, wherein the wholly aromatic polyamide staple fibers have at least two peaks in a histogram of fiber length frequency distribution thereof.

12. The wholly aromatic polyamide fiber synthetic paper sheet as claimed in claim 11, wherein in the fiber length distribution histogram, the difference in staple fiber length between two or more fibers distributed in two or more fiber length frequency distribution columns at peaks is at least 1 mm.

13. A prepreg comprising at least one wholly aromatic polyamide fiber synthetic paper sheet as claimed in claim 1 and a thermosetting resin with which the wholly aromatic polyamide fiber synthetic sheet is impregnated.

14. A laminate plate comprising at least one of the prepreg as claimed in claim 13, and heat-shaped under pressure.

* * * * *